(12) United States Patent
Hara

(10) Patent No.: US 7,106,413 B2
(45) Date of Patent: Sep. 12, 2006

(54) COOLING MECHANISM

(75) Inventor: Shinichi Hara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 99 days.

(21) Appl. No.: 10/785,804

(22) Filed: Feb. 23, 2004

(65) Prior Publication Data
US 2004/0165161 A1     Aug. 26, 2004

(30) Foreign Application Priority Data
Feb. 24, 2003   (JP)  ............... 2003-046349

(51) Int. Cl.
*G03B 27/42*   (2006.01)
*G03B 27/52*   (2006.01)
(52) U.S. Cl. .......................... 355/30; 355/53
(58) Field of Classification Search ............ 355/30, 355/53, 72, 75
See application file for complete search history.

(56) References Cited

U.S. PATENT DOCUMENTS

| 4,720,732 | A | * | 1/1988 | Tsutsui .................... 355/30 |
| 5,220,171 | A | * | 6/1993 | Hara et al. ............. 250/443.1 |
| 2001/0016302 | A1 | * | 8/2001 | Hirayanagi et al. ........ 430/322 |
| 2003/0179377 | A1 | * | 9/2003 | Masaki et al. ............. 356/400 |
| 2004/0130688 | A1 | * | 7/2004 | Emoto ....................... 355/30 |

* cited by examiner

*Primary Examiner*—Rodney Fuller
(74) *Attorney, Agent, or Firm*—Morgan & Finnegan, LLP

(57) ABSTRACT

A cooling mechanism for cooling an optical element disposed in a vacuum atmosphere includes a support part for supporting the optical element, which has a channel having an inlet, into which gas is supplied, and an outlet, from which the gas is exhausted, and a decompression mechanism, connected to the channel, for reducing pressure of the gas to be supplied.

34 Claims, 12 Drawing Sheets

PRIOR ART

COOLING MECHANISM

This application claims a benefit of foreign priority based on Japanese Patent Application No. 2003-046349, filed on Feb. 24, 2003, which is hereby incorporated by reference herein in its entirety as if fully set forth herein.

BACKGROUND OF THE INVENTION

The present invention relates generally to a cooling mechanism, and more particularly to a cooling mechanism used for an optical element in an exposure apparatus that manufactures devices, such as a single crystal substrate for a semiconductor wafer and a glass plate for a liquid crystal display ("LCD"). The present invention is suitable, for example, for a cooling mechanism for cooling an optical element in an exposure apparatus that uses as exposure light ultraviolet ("UV") light and extreme ultraviolet ("EUV") light.

There has conventionally been employed a reduction projection exposure apparatus that uses a projection optical system to project a circuit pattern on a mask or a reticle onto a wafer, etc. to transfer the circuit pattern, in manufacturing such fine semiconductor devices as a semiconductor memory and a logic circuit in the photolithography technology.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution is. Recent demands for finer semiconductor devices have promoted a shorter wavelength of ultraviolet light from an ultra-high pressure mercury lamp (i-line with a wavelength of approximately 365 nm) to KrF excimer laser (with a wavelength of approximately 248 nm) and ArF excimer laser (with a wavelength of approximately 193 nm).

The lithography using the UV light has the limit to satisfy the imminent demands for finer semiconductor devices. Accordingly, a reduction projection exposure apparatus has been developed which uses EUV light with a wavelength of 10 to 15 nm shorter than that of the ultraviolet light (referred to as an "EUV exposure apparatus" hereinafter) to efficiently transfer a very fine circuit pattern of 0.1 μm or less.

As the exposure light has a shorter wavelength, its absorption remarkably increases in a material, and becomes incompatible with use a refraction element or lens for visible light and ultraviolet light. No glass material is compatible with a EUV light's wavelength, and a reflection-type or cataoptric optical system is used which utilizes only a reflective element or multilayer mirror. A reticle also uses a reflection mask that uses an absorber on a mirror to form a pattern to be transferred.

The mirror cannot reflect all of the exposure light, but absorbs 30% or greater of the exposure light. The energy of most of the absorbed exposure light turns to residual heat, and would possibly deform a mirror's surface, causing deteriorated optical performance (in particular, imaging performance). Accordingly, a mirror is made of ceramics, such as SiC, SiN, AlN and $Al_2O_3$, which has such a small coefficient of linear thermal expansion as about 1 ppm to about 10 ppm to reduce changes of a mirror shape.

The EUV exposure apparatus is used for exposure of a circuit pattern of 0.1 μm or smaller, and is required to have such strict critical dimension precision that a projection optical system's mirror permits a deformable surface shape of only about several nanometers. A shape error budget σ (rms value) permitted to a mirror is given in the Marechal's criterion as Equation 1 below, where λ is a wavelength of EUV light, and n is the number of mirrors in the projection optical system:

$$\sigma = \frac{\lambda}{28 \times \sqrt{n}} \quad (1)$$

For example, where the EVU light has a wavelength of 13 nm and the projection optical system uses four mirrors, the shape error budget σ becomes 0.23 nm. As the exposure heats a mirror that has such a small coefficient of linear thermal expansion as several ppm in the projection optical system, a deformed surface possibly exceeds the permissible shape error, and makes imaging performance insufficient, or the resolution and contract become too low to transfer fine patterns.

Accordingly, as shown in FIG. 13, there has been proposed a method for connecting a conduit 1200 to a channel 1110 formed in a mirror holder 1100 that holds a mirror 1000, and for cooling the mirror 1000 via the mirror holder 1100 by introducing coolant, such as water, into the channel 1110 (see, for example, Japanese Patent Application Publication No. 10-209036). FIG. 13 is a schematic sectional view of the mirror 1000 for explaining a conventional mirror cooling method.

A wafer and a reticle similarly absorb exposure light and deform due to residual heats. Accordingly, as shown in FIG. 12, the wafer and reticle are cooled by connecting a conduit 1600 to a channel 1510 in the chuck 1500 that holds the reticle and the wafer, and by introducing coolant, such as water, into the channel 1510. FIG. 12 is a schematic sectional view of the chuck 1500 for explaining a conventional method for cooling the reticle and the wafer.

The cooling method shown in FIG. 13 can cool the mirror holder 1100, but cannot cools the mirror 1000 sufficiently, because the mirror holder 1100 cannot be adhered onto the mirror 1000 for control over the mirror 1000's orientations. It is conceivable to form a channel in the mirror 1000 and cool it directly, the method for cooling the reticle and the wafer shown in FIG. 12 supports a fine movement stage 1520 mounted with the chuck 1500, using only a spring 1530 with weak rigidity. Therefore, vibrations resulting from vortexes, pulsations, etc. in the channel 1510 and conduit 1600 deteriorates chuck 1500's positional stability. In addition, the heavy channel 1510 and conduit 1600 that flow water restrain movements of the fine movement stage 1520. In other words, although it is expected that, as shown in FIG. 14, a laser interferometer 1700 detects a mirror 1000 attached to the fine movement stage 1520 to precisely control a position of the fine movement stage 1520 (or positions of the reticle and the wafer), the fine movement stage 1520 has such a bad positional control response that the fine movement stage 1520 cannot move its position quickly or restrain high-frequency vibrations. Here, FIG. 14 is a schematic sectional view of the chuck 1500 for explaining positioning of the reticle and the wafer.

It is conceivable to use heat conductive gas, such as helium, for coolant instead of water to prevent generations of vortexes, pulsations, etc. The efficient cooling of the mirror and wafer requires the flow of low-temperature gas. Nevertheless, the temperature of the gas with small heat capacity easily rises before the gas reaches the mirror holder and the fine movement stage, and the gas cannot cool them sufficiently.

Japanese Patent Application Publication No. 10-209036 also proposes a method for cooling a wafer using adiabatic expansion of the gas in an aperture between the wafer and the chuck. However, the gas between the wafer and the chuck reduces the chuck's absorptive force to the wafer. For example, when the chuck has an absorptive force of about P1 kgf/cm² without gas, the chuck's absorptive force is reduced to (P1–P2) kgf/cm² if the gas exists between the wafer and the chuck with gas pressure of P2 kgf/cm². An electrostatic chuck that has a pin-shaped surface to reduce a probability of adhesions of particles usually has an absorptive force of about 100 gf/cm², and cannot use the gas having pressure above this value.

The heat quantity removable by the gas is determined by specific heat times density times flow of the gas. The low gas pressure means the low density, and the small removable heat quantity requires a long cooling time or results in insufficient cooling ability. When the pressure decreases as the exposure starts, the wafer's temperature can decrease due to adiabatic expansion. However, this configuration cannot increase the pressure so that the gas pressure becomes zero or nearly zero and the cooling ability cannot be maintained.

BRIEF SUMMARY OF THE INVENTION

Accordingly, it is an exemplary object of the present invention to provide a cooling mechanism that reduces deformations caused by thermal expansions of an optical element, which would otherwise deteriorate imaging performance, and maintains desired optical performance.

A cooling mechanism of one aspect according to the present invention for cooling an optical element disposed in a vacuum atmosphere includes a support part for supporting the optical element, the support part having a channel having an inlet, into which gas is supplied, and an outlet, from which the gas is exhausted, and a decompression mechanism, connected to the channel, for reducing pressure of the gas to be supplied.

A cooling mechanism of another aspect according to the present invention for cooling an optical element disposed in a vacuum atmosphere, the optical element having a channel having an inlet into which gas is supplied, and an outlet, from which the gas is exhausted, the cooling mechanism includes a decompression mechanism, connected to the channel, for reducing pressure of the gas to be supplied.

The decompression mechanism may be located at a side of the inlet. The cooling mechanism may further include a gas circulation system for supplying the gas while increasing the pressure of the gas, and for recovering the gas from the outlet. The decompression mechanism may have a reduced portion that has a sectional area smaller than that of the channel. The sectional area of the reduced portion may be variable, for example, continuously. The cooling mechanism may further include a temperature sensor for measuring temperatures of the optical element and/or the support part, and a controller for controlling the sectional area of the reduced portion based on a measurement result of the temperature sensor. The decompression mechanism may include an orifice. The decompression mechanism may include an enlarged portion that has a sectional area larger than that of the channel. The channel may have a first portion, and a second portion that has a sectional area larger than that of the first portion. The second portion may be closer to the optical element than the first portion. The support part may have plural channels, and the decompression parts are provided to a corresponding one of the plural channels at a different position.

An exposure apparatus of another aspect according to the present invention includes the above cooling mechanism. An exposure apparatus of still another aspect according to the present invention for illuminating a pattern with light and for exposing an object using the light from the pattern includes at least one optical element, and the above cooling mechanism.

A device fabricating method as still another aspect of the present invention includes the steps of exposing an object by using the above exposure apparatus, and developing the object exposed. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
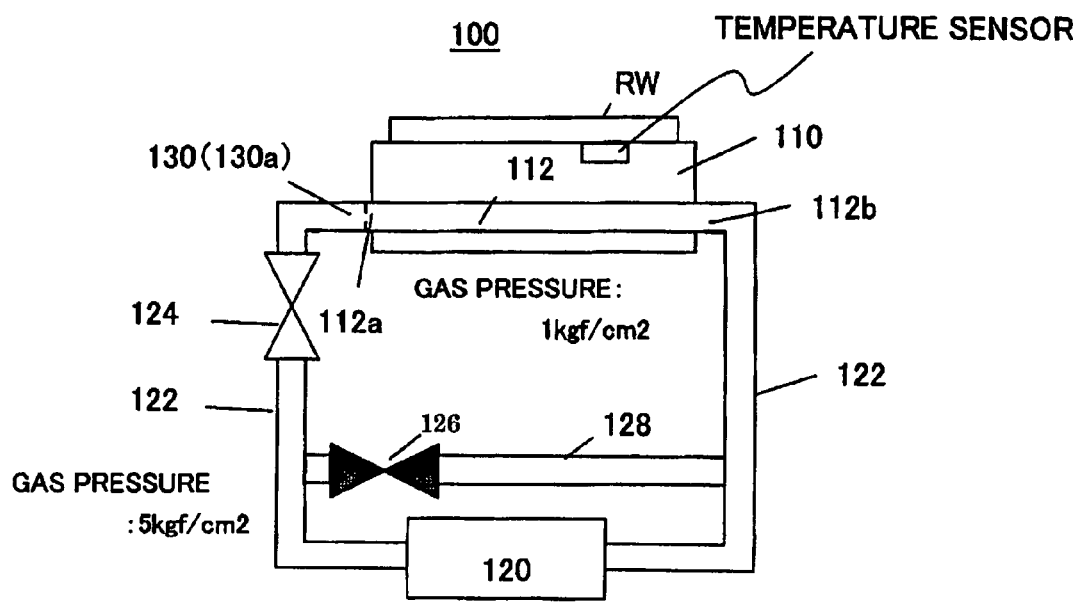
FIG. 1 is a schematic structure of an exposure apparatus of one embodiment according to the present invention.

A detailed description will now be given of a cooling mechanism 100 of one embodiment according to the present invention, with reference to accompanying drawings. In each figure, the same element is designated by the same reference numeral, and a description thereof will be omitted. Here, FIG. 1 is a schematic structure of the cooling mechanism 100.

The cooling mechanism 100 is to cool an optical element RW in a vacuum chamber. A vacuum pump (not shown) maintains the chamber to be high vacuum, for example, about $1 \times 10^{-6}$ [Pa] by so that a reaction between the residual gas component in the exposure optical path, such as polymer organic gas, and exposure light may not contaminate the optical member's surface. A description of the instant embodiment uses a reticle and a wafer as one exemplary optical element RW. The cooling mechanism 100 includes, as best shown in FIG. 1, a support part 110, a gas circulation system 120, and a decompression mechanism 130.

The support part 110 supports and positions the optical element RW in place in the vacuum atmosphere. The support part 110 forms a channel 112 that has an inlet 112a, into which gas is supplied from the gas circulation system 130, which will be described later, and an outlet 112b, from which gas is exhausted. The support part 110 is a chuck that absorbs the reticle and wafer as the optical element RW.

When the optical element RW is a mirror, the mirror instead of the support part 110 can form the channel 112. Thereby, the cooling mechanism 100 can improve its cooling effect to the mirror. In other words, when the optical element RW instead of the support part 110 can form the channel 112, if possible.

The gas circulation system 120 pressurizes and supplies the gas to the inlet 112a of the channel 112 in the support part 110, and recovers from its outlet 112b the gas that has passed through the channel 112. The gas circulation system 120 is connected to (the inlet 112a and the outlet 112b of) the channel 112 via a pipe 122. The gas supplied by the gas circulation system 120 is coolant, for example, helium gas. Therefore, the gas (or coolant) that passes through the channel 112 in the support part 110 cools the support part 110, and the optical element RW through the support part 110. The gas circulation system 120 includes, for example, a compressor, and is generally located outside the vacuum atmosphere since it cannot drive under the vacuum atmosphere.

The decompression mechanism 130 is connected to the channel 112 in the support part 110, and decompresses the gas supplied by the gas circulation system 120. The temperature drops in the gas decompressed by the decompression mechanism 130 due to the adiabatic expansion. Thereby, when the gas supplied by the gas circulation system 120 is heated after passing through the pipe 122, the temperature eventually drops sufficiently to cool the optical element RW. Therefore, the decompression mechanism 130 is preferably located at the inlet 112a, but may be located somewhere in the channel 112. The decompression mechanism 130 distant from the inlet 112a of the channel 112 results in temperature rises of the pipe 122 and the gas with small thermal capacity, as discussed above. Therefore, the decompression mechanism 130 is preferably located within about 2 m from the inlet 112a.

The decompression mechanism 130 includes an orifice 130a that has a sectional area smaller than that of the channel 112 in the instant embodiment, but may have any other structure as far as the pressure of the gas supplied from the gas circulation system 120 can be reduced or the gas can be adiabatically expanded.

The cooling mechanism 100 pressurizes the helium gas to 5 kgf/cm$^2$ using the gas circulation system 120, and introduces the gas to the channel 112 in the support part 110 through the pipe 122. The orifice 130a arranged at the inlet 122a of the channel 122 reduces the pressure of the helium gas down to 1 kgf/cm$^2$ and the adiabatic expansion associated with the pressure reduction lower the temperature of the helium gas.

Figure 2:
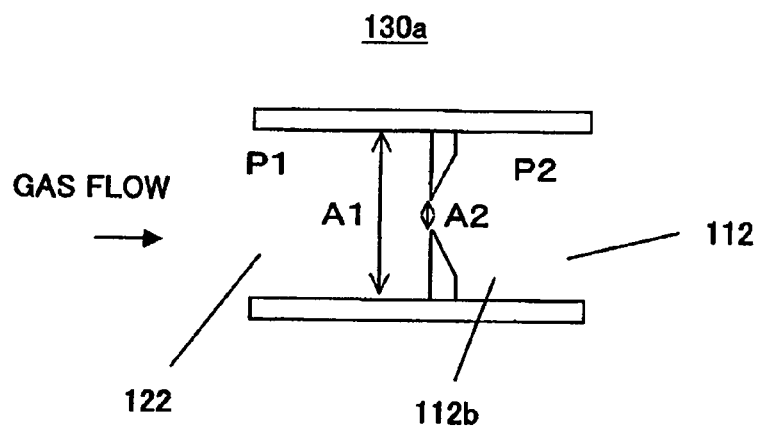
FIG. 2 is an enlarged view of an orifice shown in FIG. 1.

A description will now be given of a temperature reduction of the gas by the decompression mechanism 130. FIG. 2 is an enlarged sectional view of the orifice 130a shown in FIG. 1. Referring to FIG. 2, Equation 2 is met where $A_1$ is a sectional area of the pipe 122, $A_2$ is an opening area of the orifice 130a, A is an area ratio of $A_2/A_1$, $C_o$ is a constant determined by the area ratio A, V is a gas flow, $\rho_o$ is a gas density, $P_1$ is a gas pressure before the gas passes through the orifice 130a, and $P_2$ is a gas pressure after the gas passes through the orifice 130a:

$$V = C_o A (2(P_1 - P_2)/\rho_o)^{0.5} \tag{2}$$

When the orifice 130a has an opening with a diameter of 2 mm and an area ratio A is 0.5, the constant $C_o$ determined by the area ratio A is 0.7. When the gas flow is 0.005 m$^3$/s, the gas density $\rho_o$ is 0.162 kg/m$^3$, and the gas pressure $P_1$ before the gas passes through the orifice 130a is 5 kgf/cm$^2$, the gas pressure $P_2$ after the gas passes through the orifice 130a becomes instantly reduced to 1 kgf/cm$^2$ from Equation 2, resulting in the gas's temperature drop due to the adiabatic expansion.

This temperature decrease meets the following Equation 3, where $T_1$ is the gas's temperature before the gas passes through the orifice 130a, $T_2$ is the gas's temperature after the gas passes through the orifice 130a, and r is a ratio of specific heat:

$$T_1 \cdot P_2^{(r-1)/r} = T_2 \cdot P_1^{(r-1)/r} \tag{3}$$

When the gas's temperature $T_1$ before the gas passes through the orifice 130a is 300 K and the ratio r of specific heat is 1.3, the gas's temperature $T_2$ after the gas passes through the orifice 130a becomes 200 K from Equation 3. In other words, the gas's temperature $T_2$ after the gas passes through the orifice 130a drops from the gas's temperature $T_1$ before the gas passes through the orifice 130a by 70° C.

Turning back to FIG. 1, the heat conduction between the helium gas with the reduced temperature and the channel 112 cools the support part 110, and the optical element RW via the support part 110. The helium gas that passes through the channel 112 in the support part 110 returns from the outlet 112b to the gas circulation part 120 via the pipe 122, and pressurized again to 5 kgf/cm$^2$, repeating the above cycle.

While the instant embodiment reduces the pressure of the gas from 5 kgf/cm$^2$ to 1 kgf/cm$^2$, the gas's temperature drop is not limited to this embodiment as far as the gas's temperature drops sufficiently to deprive necessary heat quantity. According to the instant inventor's studies, a reduction from 5 kgf/cm$^2$ to 4 kgf/cm$^2$ or a pressure change of about 20% or greater drops the gas's temperature by about 15° C. enough for cooling sufficiently.

If the gas that has passed through the decompression mechanism 130 does not have the pressure of about 0.1 kgf/cm$^2$ or greater, the total heat capacity of the gas is too small to deprive the necessary heat quantity. Therefore, the gas has the pressure of preferably 0.1 kgf/cm$^2$ or greater after decompressed.

When the support part 110 does not have to cool the optical element RW, the gas circulates in a bypass pipe 128 by closing a stop valve 124 and opening a stop valve 126 for the bypass pipe 128. Thereby, the low-temperature gas does not flow through the channel 112 in the support part 110.

Figure 3:
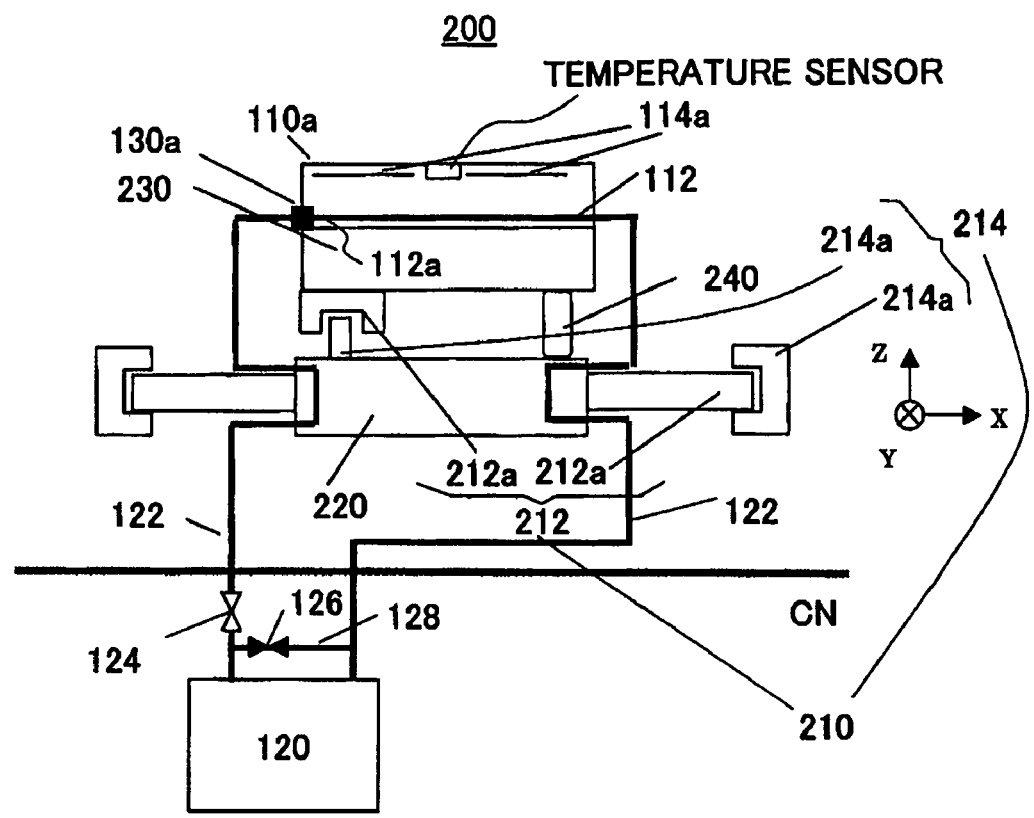
FIG. 3 is a schematic structure of a wafer stage that applies an inventive cooling mechanism.

FIG. 3 is a schematic structure of a wafer stage 200 that applies the inventive cooling mechanism 100. The wafer stage 200 is a stage that uses a linear motor for an exposure apparatus. Referring to FIG. 3, the linear motor 210 includes a magnetic pole unit 212, and an armature unit 214. The magnetic pole unit 212 includes magnets 212a arranged at predetermined intervals so that magnetic poles are alternately different in a Y-axis. The armature unit 214 includes a coil 214a that flows current. The Lorentz force caused by an interaction between the current that flows through the coil 214a and the magnetic flux of the magnet 212a moves a rough movement stage 220 in the Y-axis direction where the armature unit 214 serves as a stator, and the magnetic pole unit 212 serves as a rotator. Similarly, the X-axis linear motor (not shown) moves the rough movement stage 220 in the X-axis direction.

A wafer fine movement stage 230 arranged on the rough movement stage 220 is supported by a spring 240 that has weak rigidity in a Z direction, and minutely positioned in the Z direction to the rough movement stage 220 by a Z-direction moving linear motor. Similarly, linear motors for movements in X and Y directions (not shown) minutely position to the rough movement stage 220 in the X and Y directions.

The stage 200 enables the helium gas pressurized by the gas circulation system 120 to flow through the channel 112 in the support part 110 (as a wafer chuck 110a in the instant embodiment). In this case, the orifice 130a near the inlet 112a of the channel 112 reduces the pressure of the helium gas, and the adiabatic expansion associated with this pressure reduction lowers the temperature of the helium gas. The heat conduction between the cooled helium gas and the channel 112 cools the wafer chuck 110a, and the wafer through the wafer chuck 110a. The wafer chuck 110a absorbs the wafer and restrains its thermal distortion by applying current to the electrode 114a.

The fine movement stage 230 moves relative to the rough movement stage 220, which moves relative to a vacuum chamber CN. Therefore, the pipe 122 is made flexibly movable between the gas circulation system 120 and the rough movement stage 220, and between the fine movement stage 230 and the rough movement stage 220. The reticle chuck can cool the reticle chuck and reticle by a similar structure.

Figure 4:
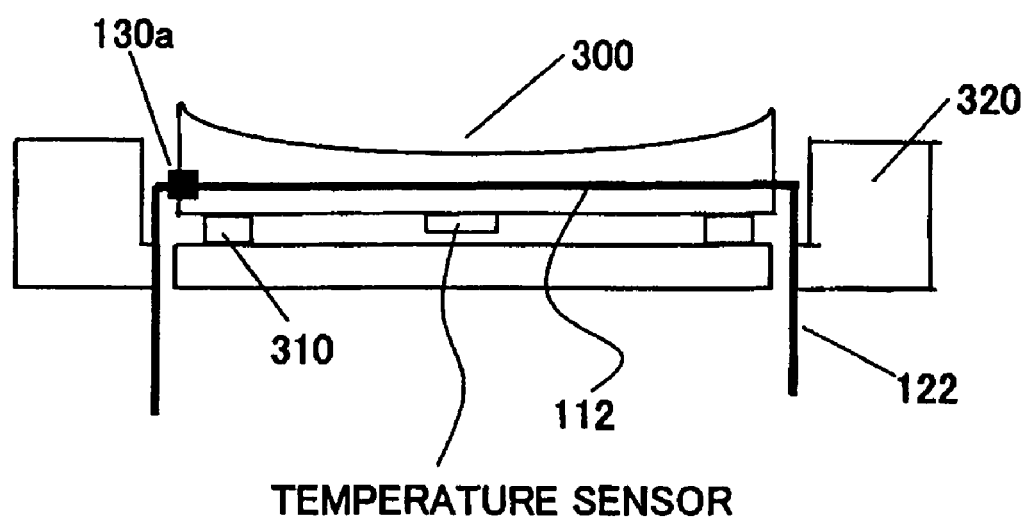
FIG. 4 is a schematic structure of a mirror that applies an inventive cooling mechanism.

FIG. 4 is a schematic structure of a mirror 300 that applies the inventive cooling mechanism 100. The mirror 300 is supported by the mirror holder 320 via an actuator 310, for example, of a piezo-electric type. When the actuator 310 is driven, an orientation of the mirror 300 can be changed.

Referring to FIG. 4, the helium gas pressurized by the gas circulation system (not shown) flows through the channel 112 formed in the mirror 300. In this case, the orifice 130a near the inlet 112a of the channel 112 reduces the pressure of the helium gas, and the adiabatic expansion associated with this pressure reduction lowers the temperature of the helium gas. The heat conduction between the cooled helium gas and the channel 112 cools the mirror 300.

Since the actuator 310 moves the mirror 300 relative to the mirror holder 320, the pipe 122 is made flexibly movable between the mirror holder 320 and the mirror 300.

A temperature sensor (not shown), provided on the mirror 300, may provide temperature control to the desired temperature through opening and closing the stop valves 124 and 126. The decompression mechanism 130 can be made as a variable stop, and control to the desired temperature can vary conductance of the variable stop.

As discussed, the cooling mechanism 100 provides gas cooling, and solves such problems associated with water cooling, as vibrations that result from vortexes and pulsations in the channel and pipe and deteriorate positional stabilities of the wafer chuck and the reticle chuck, bad positional control response of the fine movement stage which results from the heavy pipe that flows water, and has a difficulty in restraining high-frequency vibrations, and bad mirror's position stability due to vibrations form the mirror holder to the mirror.

When the decompression mechanism has a simple structure, such as an orifice, it can be located close to the chuck or mirror. Therefore, even when the temperature of the pipe increases the temperature of the gas while the gas reaches the chuck and the mirror, the gas's temperature can be lowered to cool the chuck or mirror and remove the necessary heat from it.

Since the gas is not directly introduced between the chuck and the wafer or between the chuck and the reticle in cooling the chuck, the chuck's force to absorb the wafer does not reduce and a plane rectification is available between the wafer and the reticle.

A channel is directly formed in the mirror in cooling the mirror. This is because gas flowing through the channel reduces problems of vibrations caused by vortexes and pulsations in the channel and pipe associated with the water cooling, and does not deteriorate the mirror's positional stabilities. Since the mirror can be directly cooled, such insufficient cooling problems associated with cooling the mirror holder can be solved as an arrangement that cannot adhere the mirror holder to the mirror due to the mirror's orientation control.

Since the decompression mechanism, such as an orifice, reduces the pressure of the gas that has been pressurized by the gas circulation system, the gas's pressure does not become zero or close to zero. Therefore, gas's density does not become too small to maintain the cooling ability, but the gas can maintain its cooling ability over a long time. When the stop valve stops gas flow, cooling stops immediately and sets the temperature to the desired temperature.

Figure 5:
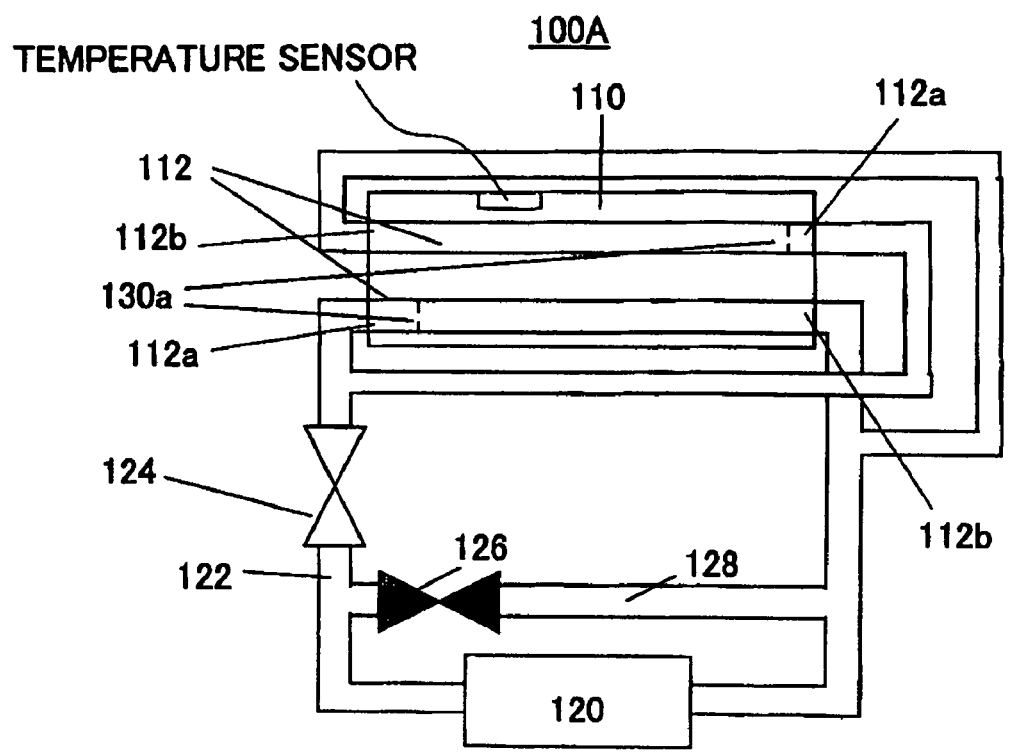
FIG. 5 is a schematic structure of a variation of a cooling mechanism shown in FIG. 1.

Referring now to FIG. 5, a description will be given of a cooling mechanism 100A as a variation of the cooling mechanism 100 shown in FIG. 1. FIG. 5 is a schematic structure of the cooling mechanism 100A. The cooling mechanism 100A is similar to the cooling mechanism 100 in that the orifice 130a reduces the pressure of the gas that has been pressurized by the gas circulation system 120, and cools the support part 110, but different from the cooling mechanism 100 in that the support part 100 has plural channels 112.

Each of the channels 112 has the orifice 130a. When the number of orifices 130a is one, the temperature of the gas that has just passed through the orifice 130a is the lowest, and the heat conduction with the support part 110 gradually increases the gas's temperature, and makes the chuck's temperature uneven. Accordingly, each channel 112 has the orifice 130a at a different position to cool the entire support part 110 evenly, and makes the chuck's temperature uneven. The entire support part 110 can be more evenly cooled, when gas flows alternately in plural channels as in the instant embodiment (or the inlet 112a and the outlet 112b alternate).

Figure 6:
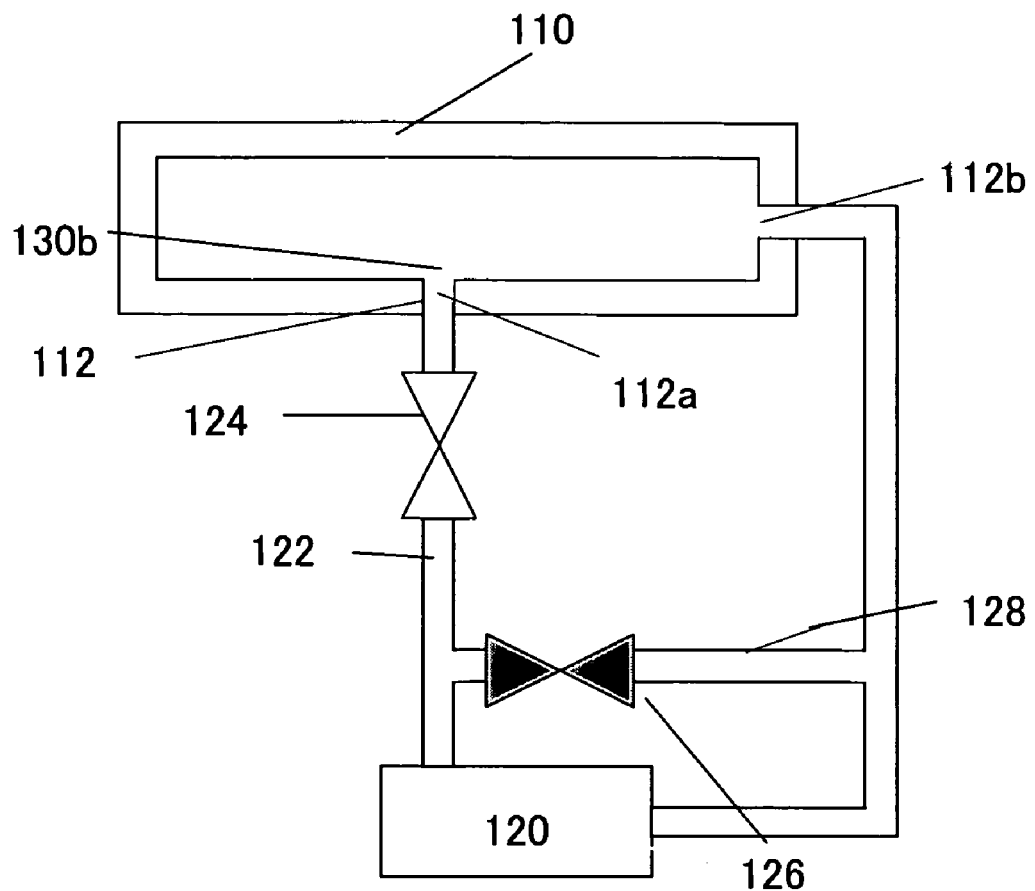
FIG. 6 is a schematic structure of another variation of a cooling mechanism shown in FIG. 1.

Referring now to FIG. 6, a description will be given of a cooling mechanism 100B as another variation of the cooling mechanism 100 shown in FIG. 1. FIG. 6 is a schematic structure of the cooling mechanism 100B. The cooling mechanism 100B is similar to the cooling mechanism 100 except for a structure of the decompression mechanism 130. The cooling mechanism 100 lowers the gas's pressure using the orifice, whereas the cooling mechanism 100B uses an enlarged portion 130b as the decompression mechanism 130, which has a sectional area larger than that of the channel 112.

As the gas supplied from the gas circulation system 120 passes through the enlarged portion 130b, its pressure reduces and the temperature decreases due to the adiabatic expansion associated with the pressure reduction. The heat conduction between cooled gas and the channel 112 cools the support part 110, and the optical element RW through the support part 110.

The enlarged portion 130b preferably has a sectional area three times as large as that of the channel 112. The enlarged portion 130b enlarges the surface area of the channel 112, and cools a wide range of the support part 110 for improved evenness of the temperatures of the support part 110 and the optical element RW. The channel 112 reduces its sectional area at the outlet 112b, increasing the gas's pressure and temperature. The gas's temperature rises near the outlet 112b without heating the support part 110, and thus does not affect the temperature of the support part 110.

Figure 7:
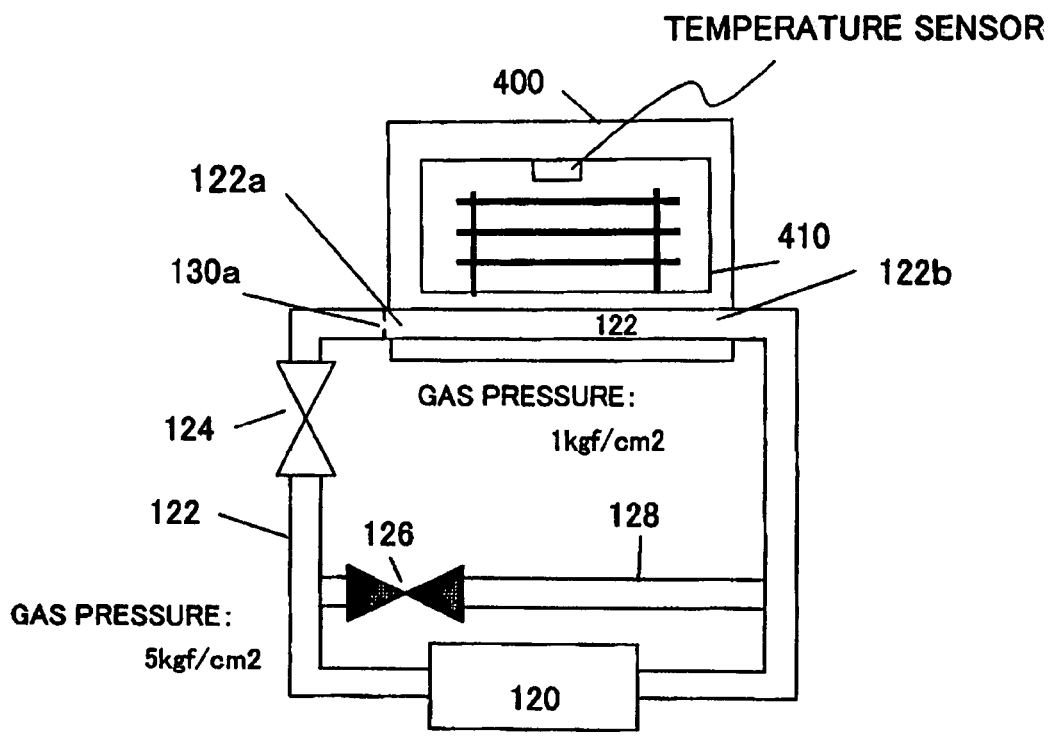
FIG. 7 is a schematic structure of one example of a cooling jacket that applies an inventive cooling mechanism.

FIG. 7 is a schematic structure of one example of a cooling jacket 400 that applies the inventive cooling mechanism 100. Referring to FIG. 7, an electric board 410 is enclosed by the cooling jacket 400. The gas is cooled by adiabatic expansion at the orifice 130a and then introduced into the channel 112 formed by this cooling jacket 400. The heat conduction between the cooled gas and the channel 112 cools the cooling jacket 400, preventing the electric board 410 from heating the peripheral.

Figure 8:
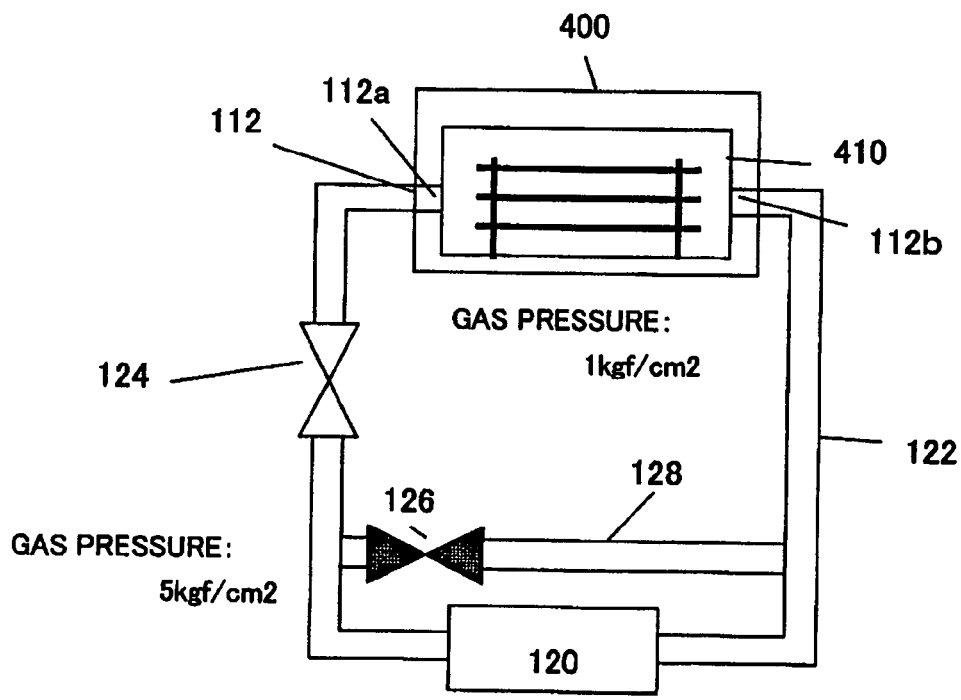
FIG. 8 is a schematic structure of another example of a cooling jacket that applies an inventive cooling mechanism.

As shown in FIG. 8, the electric board 410 may be provided with an enlarged portion 130b as the decompression mechanism 130 formed by the cooling jacket 400 so that the electric board 410 itself can be cooled by the gas that has been cooled by the enlarged portion 130b. Thereby, the electric board 410 is prevented from heating the peripheral. This structure can cool the electric board 410 itself, preventing deteriorations of features, which would occur when the electric board 410 becomes hot. Of course, this embodiment is applicable to cool heating elements, such as a motor and an actuator, in addition to the electric board 410. Here, FIG. 8 is a schematic structure of another example of cooling jacket 400 that applies the inventive cooling mechanism 100.

The above orifice (as means for reducing a sectional area of the channel) can be combined with the embodiment shown in FIG. 6 or FIG. 8 to reduce the pressure of the gas that flows through the channel and improve a cooling effect.

The orifice (as means for reducing a sectional area of the channel) shown in FIGS. 1–5, and 7, can be equipped with a mechanism for varying a sectional area of the channel at a portion that uses the orifice. This structure can control a reduction of the pressure of the gas that flows through the channel, a reduction of the temperature of the gas, and a cooling effect to an object to be cooled, such as a mirror, a lens and an electric board. The mechanism for varying the sectional area of the channel may include a temperature sensor that measures the temperature of the object to be cooled, in a contact or non-contact manner, and varies the sectional area of the channel based on an output result from the temperature sensor for control over the cooling effect to the object to be cooled.

Figure 9:
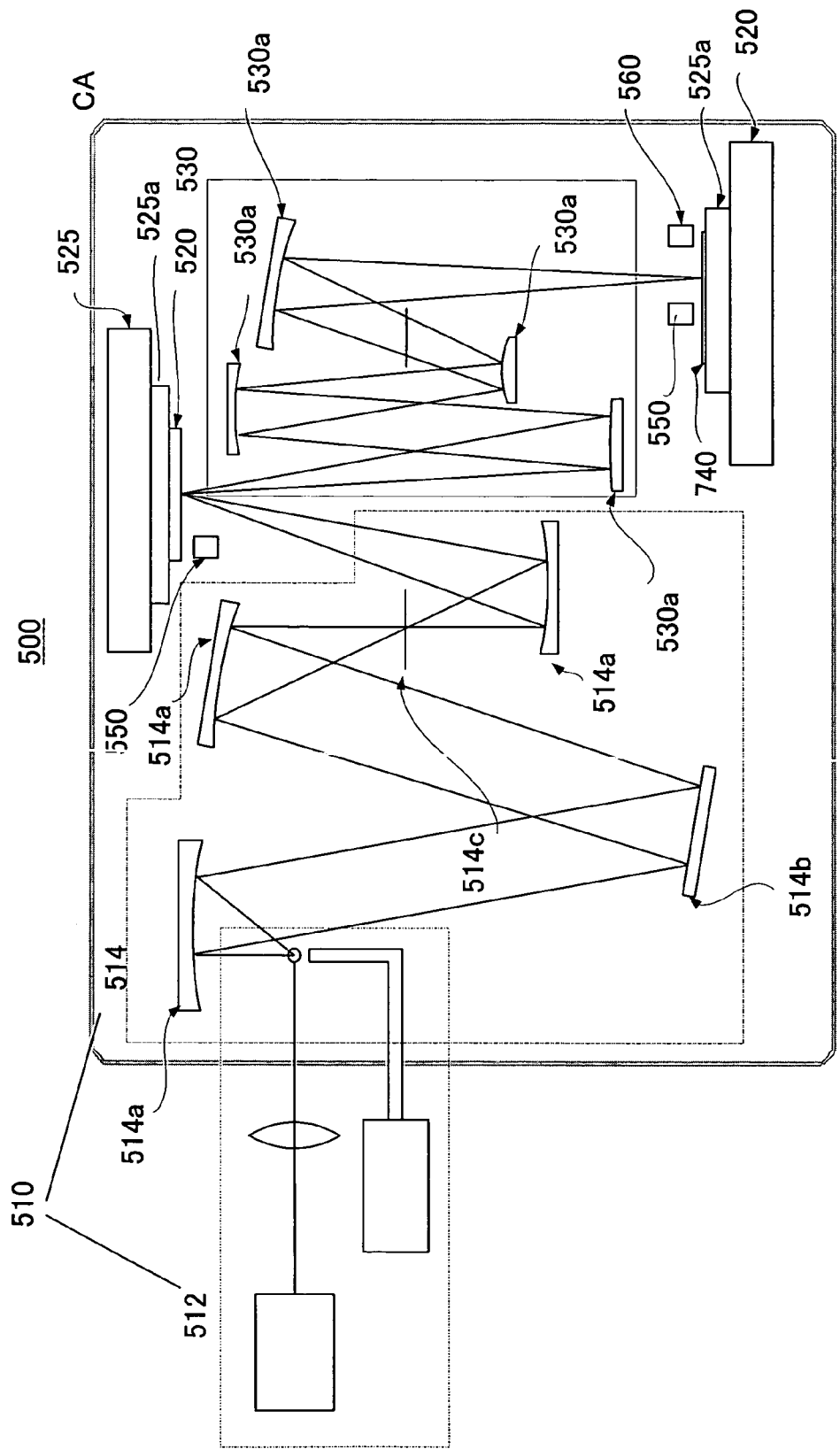
FIG. 9 is a schematic structure of an exemplary exposure apparatus according to the present invention.

Referring now to FIG. 9, a description will be given of an exemplary exposure apparatus 500 that applies the inventive cooling mechanism 100. FIG. 9 is a schematic structure of the exposure-apparatus 500.

The inventive exposure apparatus 500 is a projection exposure apparatus that uses, as illumination light for exposure, EUV light (e.g., with a wavelength of 13.4 nm) to perform a step-and-scan or step-and-repeat exposure that transfers a circuit pattern on a mask 520 onto an object 540 to be exposed. Such an exposure apparatus is suitably applicable to a lithography process below submicron or quarter-micron, and a description will be given below of this embodiment exemplarily using a step-and-scan exposure apparatus (which is also called "a scanner"). The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The exposure apparatus 500 includes, as shown in FIG. 9, an illumination apparatus 510, the mask 520, a mask stage 525 that mounts the mask 520, a projection optical system 530, the object 540, and a wafer stage 545 that mounts the object 540, an alignment detection mechanism 550, and a focus position detecting mechanism 560.

As shown in FIG. 9, at least the optical path through which the EUV light travels (or the entire optical system) should preferably be maintained in a vacuum atmosphere VC, since the EUV light has low transmittance to the air and causes contaminations as a result of response to components of residual gas (or polymer organic gas).

The illumination apparatus 510 uses arc EUV light corresponding to an arc field in the projection optical system 530, to illuminate the mask 520, and includes an EUV light source 512 and an illumination optical system 514.

The EUV light source 512 uses, for example, a laser plasma light source. The laser plasma light source irradiates a highly intensified pulse laser beam to a target material put in vacuum, thus generating high-temperature plasma for use as EUV light with a wavelength of about 13 nm emitted from this. The target material may use a metallic thin film, inert gas, and droplets, etc. The pulse laser preferably has high repetitive frequency, e.g., usually several kHz, for increased average intensity of the emitted EUV light.

The illumination optical system 514 includes condenser mirrors 514a and an optical integrator 514b. The condenser mirror 514a condenses EUV light that is radiated approximately isotropically from the laser plasma light source. The optical integrator 514b uniformly illuminates the mask 120 with a predetermined numerical aperture. The illumination optical system 514 further includes an aperture 514c at a position conjugate with the mask 520, which limits an illumination area of the mask 520 to an arc shape.

The mask 520 is a reflection reticle, and forms, on a mirror, a circuit pattern (or image) to be transferred. The mask 520 is supported and driven by a mask stage 525. The diffracted light emitted from the mask 520 is projected onto the object 540 after reflected by the projection optical system 530. The mask 520 and object 540 are arranged optically conjugate with each other. Since the exposure apparatus 500 of this embodiment is a scanner, the mask 520 and object 540 are scanned to project a reduced size of a pattern on the mask 520, onto the object 540.

The mask stage 525 supports the mask 520 via a chuck 525a, and is connected to a moving mechanism (not shown). The mask stage 525 can use any structure known in the art. The moving mechanism (not shown) includes a linear motor, etc., and moves the mask 520 by driving the mask stage 525 at least in a direction X. The exposure apparatus 500 scans the mask 520 and the object 540 synchronously. Here, X is a scan direction on the mask 520 or the object 540, Y is a direction perpendicular to it, and Z is a perpendicular direction on the surface of mask 520 or the object 540. The inventive cooling mechanism 100 is applicable to the chuck 525a of the mask stage 525. The cooling mechanism 100 cools the mask 520 via the chuck 525a, and can prevent deformations caused by thermal expansions.

The projection optical system 530 uses plural multilayer mirrors 530a to project a reduced size of a pattern formed on the mask 520 onto the object 540 at an image surface. The number of mirrors is about four to six. For wide exposure area with the small number of mirrors, the mask 520 and object 540 are simultaneously scanned to transfer a wide area that is an arc-shaped area or ring field apart from the optical axis by a predetermined distance. The projection optical system 530 has a numerical aperture ("NA") of about 0.2 to 0.3. The inventive cooling mechanism 100 is applicable to the mirror 530a as an optical element in the projection optical system 530. The cooling mechanism 100 cools the mirror 530a, and can prevent deformations caused by thermal expansions, providing excellent imaging performance.

The object 140 is a wafer in the instant embodiment, but may cover any object to be exposed, such as a LCD, and photoresist is applied to the object 540. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

The object 540 is supported by the wafer stage 545 through a wafer chuck 545a. The wafer stage 545 uses, for example, a linear motor to move the object 540 in X-Y-Z directions. The mask 520 and object 540 are scanned synchronously, and the positions of the mask stage 525 and wafer stage 545 are monitored, for example, by a laser interferometer and the like, so that both are driven at a constant speed ratio. The inventive cooling mechanism 100 is applicable to the wafer chuck 545a of the wafer stage 545. The cooling mechanism 100 cools the wafer chuck 545a, and can prevent deformations caused by thermal expansions.

The alignment detection mechanism 550 measures positional relationships between the mask 520 and the optical axis of the projection optical system 530, and between the object 540 and the optical axis of the projection optical system 530, and sets positions and angles of the mask stage 525 and the wafer stage 545 so that a projected image of the mask 520 accords with a predetermined position on the object 540.

The focus position detection mechanism 560 measures a focus position of the object 540 in a direction Z, controls a position and an angle of the wafer stage 545, and always maintains a surface of the object 540 at an image position by the projection optical system 530 during exposure.

In exposure, the EUV light emitted from the illumination apparatus 510 illuminates the mask 520, and images a pattern of the mask 520's surface onto the object 540's surface. The instant embodiment uses an arc or ring shaped image plane, scans the reticle 520 and object 540 at a speed ratio corresponding to a reduction ratio to expose the entire surface of the reticle 520.

The exposure apparatus 500 having the cooling mechanism 100 maintains thermal expansions as low as possible, and provides devices, such as semiconductor devices, LCD devices, image pickup devices (e.g., CCDs), and thin-film magnetic heads, with excellent resolution, throughput, and economic efficiency.

Figure 15:
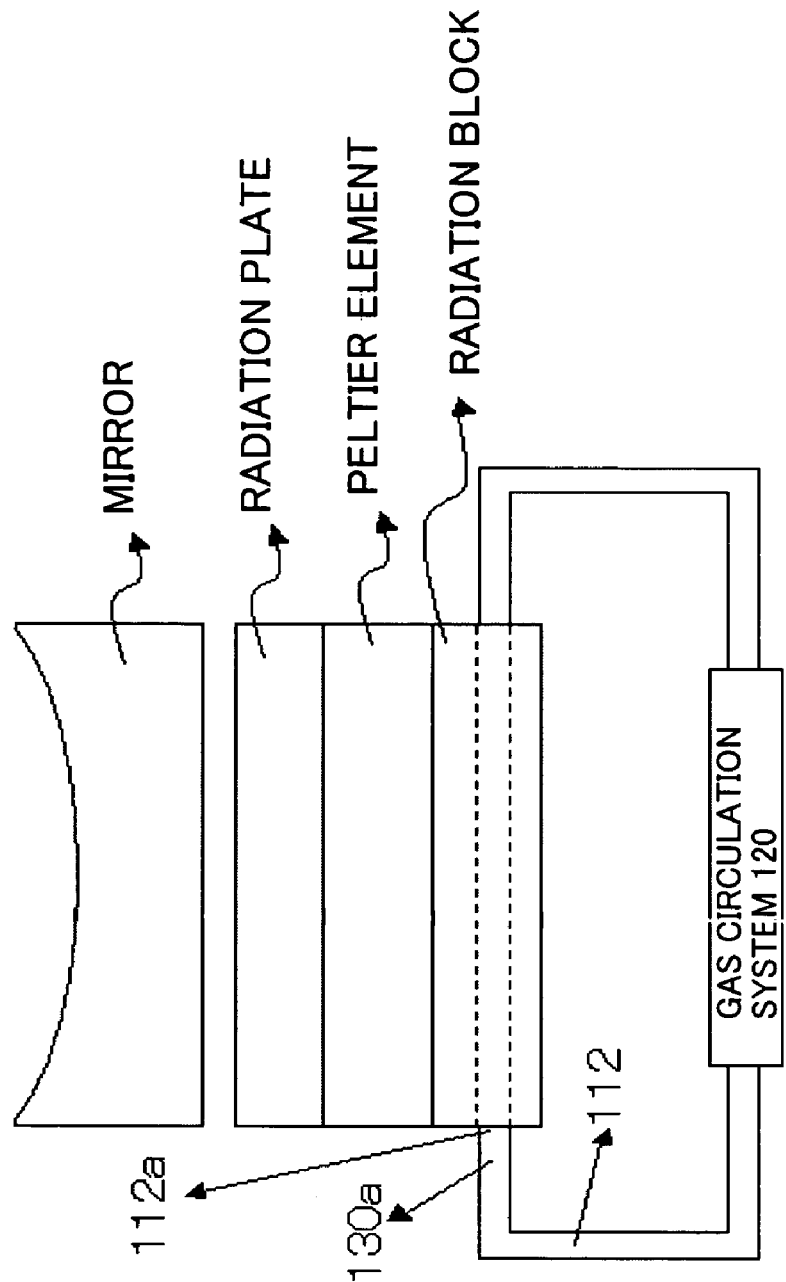
FIG. 15 is a schematic block diagram of the inventive cooling mechanism applied to an exposure apparatus.

In applying the inventive cooling mechanism to an exposure shown in FIG. 9, the structure shown in FIG. 15 may be used which includes a radiation plate (or member) that cools a mirror in the exposure apparatus 500 through radiation, a Peltier element that controls the temperature of the radiation member, and a radiation block that contacts the Peltier element. This structure can cool the radiation block, properly controls, in response to a signal from a temperature sensor for sensing the temperatures of the radiation block and/or the radiation plate, a temperature difference between the radiation block and the radiation plate using the Peltier element, and controls the temperature of the radiation plate. As a consequence, the temperature of the mirror can be properly controlled, and variances of the mirror's optical performance that results from temperature-induced deformations (such as deteriorations and changes of the imaging performance of the projection optical system) can be reduced.

Figure 10:
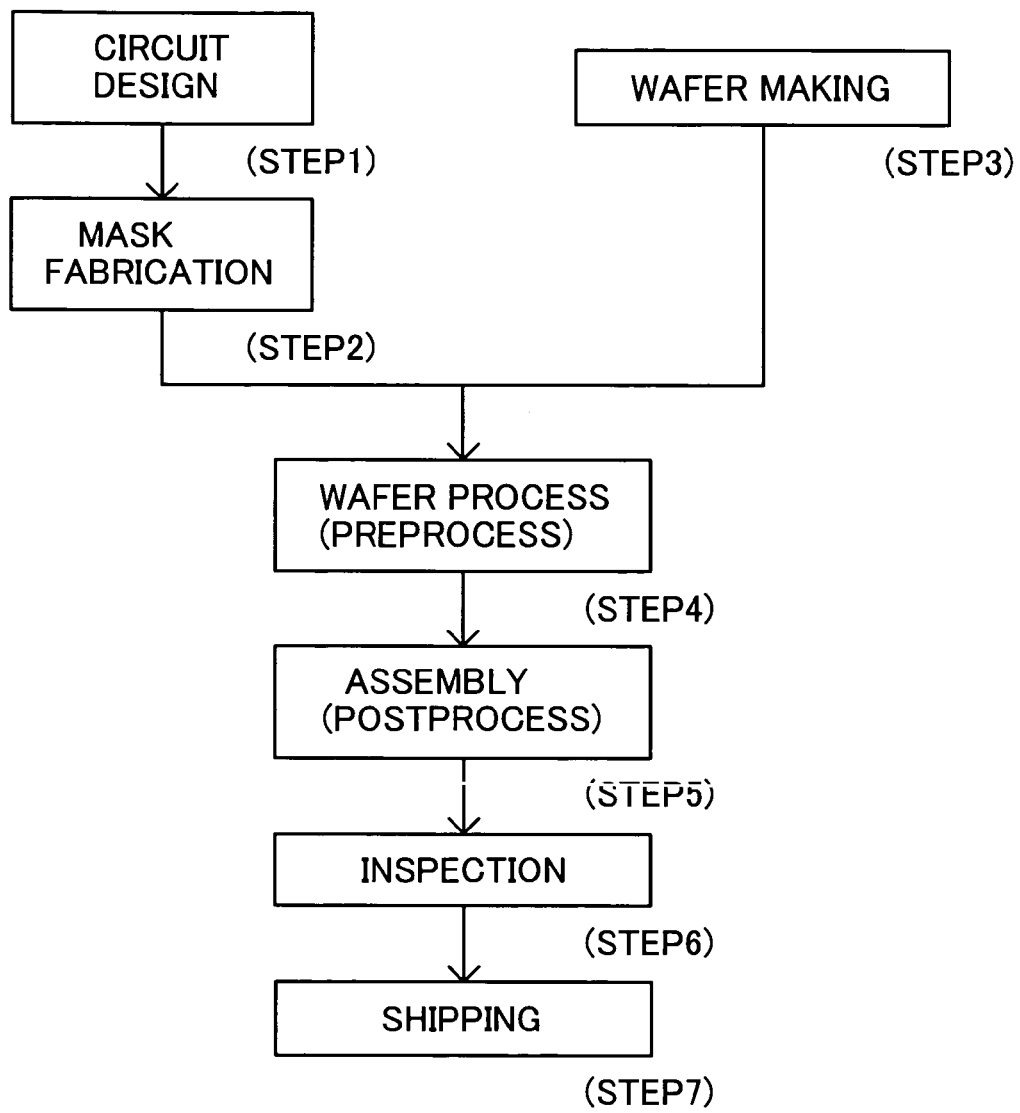
FIG. 10 is a flowchart for explaining how to fabricate devices (such as semiconductor chips such as ICs and LSIs, LCDs, CCDs, and the like).
Figure 11:
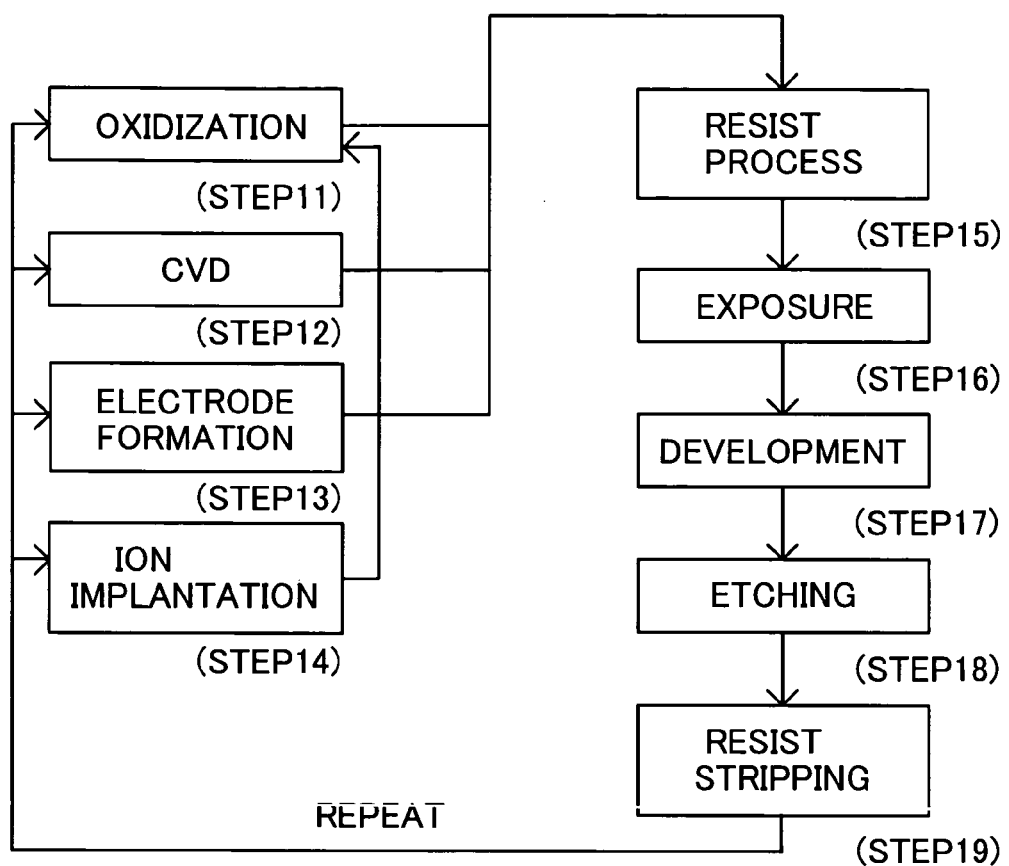
FIG. 11 is a flowchart for Step 4 that is a wafer process shown in FIG. 6.
Figure 12:
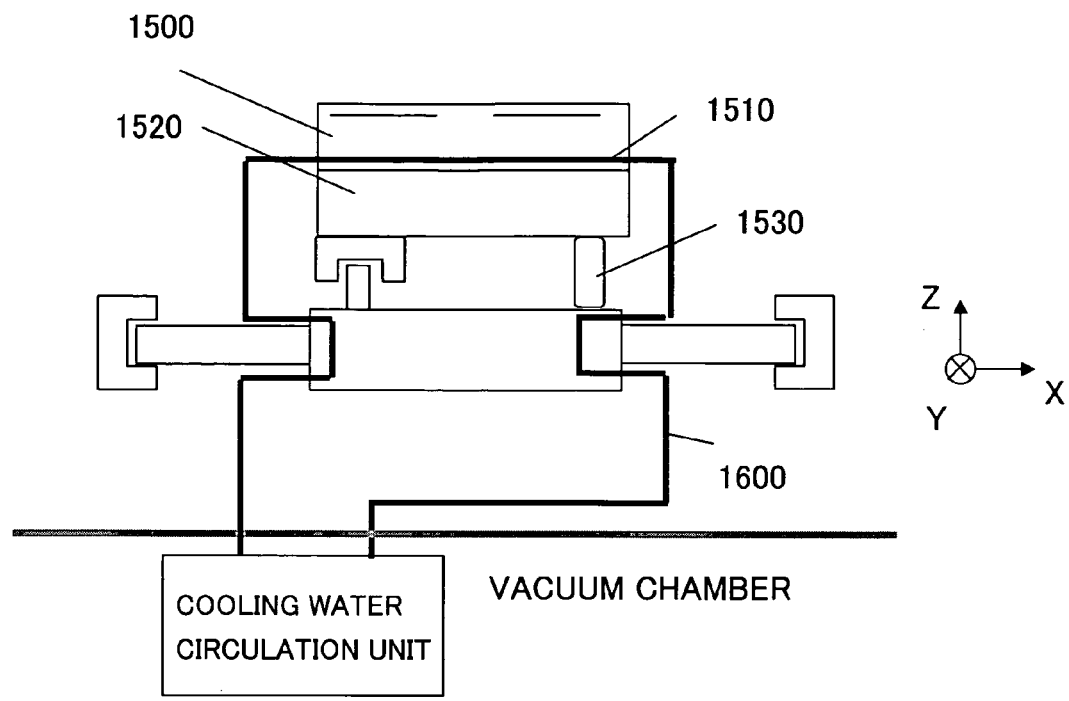
FIG. 12 is a schematic sectional view of a mirror for explaining a conventional mirror cooling method.
Figure 13:
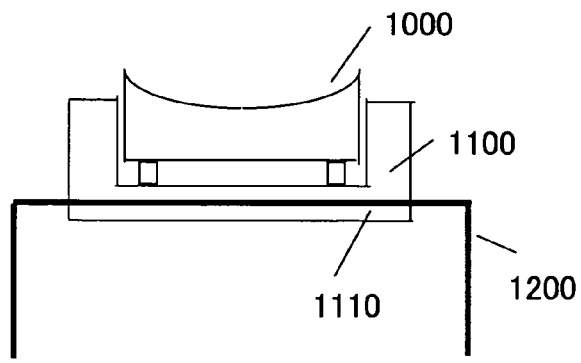
FIG. 13 is a schematic sectional view of a chuck for explaining a conventional cooling method for a wafer and a reticle.
Figure 14:
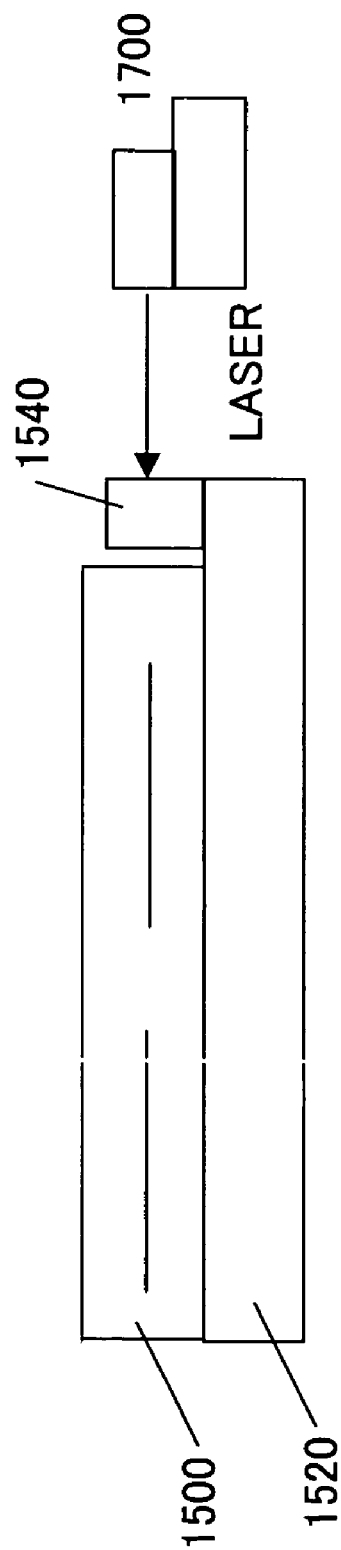
FIG. 14 is a schematic sectional view of a chuck for explaining positioning the reticle and the wafer.

Referring to FIGS. 10 and 11, a description will now be given of an embodiment of a device fabricating method using the above exposure apparatus 500. FIG. 10 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 500 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of the instant embodiment may manufacture higher quality devices than the prior art. In this manner, the device fabricating method that uses such an exposure apparatus 100 and the device as a final product serve as other aspects according to the present invention.

Further, the present invention is not limited to these preferred embodiments, but various modifications and variations may be made without departing from the spirit and scope of the present invention. For example, the present invention is applicable to an exposure apparatus that uses as a light source ArF excimer laser, $F_2$ laser, electron beam ("EB") and synchrotron radiation ("SR").

This invention can provide a cooling apparatus that provide a cooling mechanism that reduces deformations caused by thermal expansions of an optical element, which would otherwise deteriorate imaging performance, and maintains desired optical performance.

What is claimed is:

1. A cooling mechanism for cooling an optical element disposed in a vacuum atmosphere, said cooling mechanism comprising:
a support part for supporting the optical element, said support part having a channel having an inlet, into which gas is supplied, and an outlet, from which the gas is exhausted;
a decompression mechanism, connected to the channel, for reducing pressure of the gas to be supplied; and
a temperature sensor for measuring temperatures of the optical element and/or the support part,
wherein said decompression mechanism controls the pressure of the gas to be supplied, based on an output of the temperature sensor.

2. A cooling mechanism according to claim 1, wherein said decompression mechanism is located at a side of the inlet.

3. A cooling mechanism according to claim 1, further comprising a gas circulation system for supplying the gas while increasing the pressure of the gas, and for recovering the gas from the outlet.

4. A cooling mechanism according to claim 1, wherein said decompression mechanism has a reduced portion that has a sectional area smaller than that of the channel.

5. A cooling mechanism according to claim 4, wherein the sectional area of the reduced portion is variable.

6. A cooling mechanism according to claim 5, wherein the sectional area of the reduced portion is continuously variable.

7. A cooling mechanism according to claim 5, further comprising a controller for controlling the sectional area of the reduced portion based on a measurement result of said temperature sensor.

8. A cooling mechanism according to claim 1, wherein said decompression mechanism includes an orifice.

9. A cooling mechanism according to claim 1, wherein said decompression mechanism includes an enlarged portion that has a sectional area larger than that of the channel.

10. A cooling mechanism according to claim 1, wherein the channel has a first portion, and a second portion that has a sectional area larger than that of the first portion.

11. A cooling mechanism according to claim 10, wherein the second portion is closer to the optical element than the first portion.

12. A cooling mechanism according to claim 1, wherein the support part has plural channels, and said decompression parts are provided to a corresponding one of the plural channels at a different position.

13. A cooling mechanism for cooling an optical element disposed in a vacuum atmosphere, the optical element having a channel having an inlet into which gas is supplied, and an outlet, from which the gas is exhausted, said cooling mechanism comprising:
a decompression mechanism, connected to the channel, for reducing pressure of the gas to be supplied;
a temperature sensor for measuring a temperature of the optical element,
wherein said decompression mechanism controls the pressure of the gas to be supplied, based on an output of the temperature sensor.

14. A cooling mechanism according to claim 13, wherein said decompression mechanism is located at a side of the inlet.

15. A cooling mechanism according to claim 13, further comprising a gas circulation system for supplying the gas while increasing the pressure of the gas, and for recovering the gas from the outlet.

16. A cooling mechanism according to claim 13, wherein the decompression mechanism has a reduced portion that has a sectional area smaller than that of the channel.

17. A cooling mechanism according to claim 16, wherein the sectional area of the reduced portion is variable.

18. A cooling mechanism according to claim 16, wherein the sectional area of the reduced portion is continuously variable.

19. A cooling mechanism according to claim 16, further comprising a controller for controlling the sectional area of the reduced portion based on a measurement result of said temperature sensor.

20. A cooling mechanism according to claim 13, wherein said decompression mechanism includes an orifice.

21. A cooling mechanism according to claim 13, wherein said decompression mechanism includes an enlarged portion that has a sectional area larger than that of the channel.

22. A cooling mechanism according to claim 13, wherein the channel has a first portion, and a second portion that has a sectional area larger than that of the first portion.

23. An exposure apparatus comprising a cooling mechanism for cooling an optical element disposed in a vacuum atmosphere, wherein the cooling mechanism includes a support part for supporting the optical element, said support part having a channel having an inlet into which gas is supplied, and an outlet, from which the gas is exhausted, and a decompression mechanism, connected to the channel, for reducing pressure of the gas to be supplied, and a temperature sensor for measuring temperatures of the optical element and/or the support part, wherein said decompression mechanism controls the pressure of the gas to be supplied, based on an output of the temperature sensor.

24. An exposure apparatus comprising a cooling mechanism for cooling an optical element disposed in a vacuum atmosphere, the optical element having a channel having an inlet, into which gas is supplied, and an outlet, from which the gas is exhausted, wherein said cooling mechanism includes a decompression mechanism, connected to the channel, for reducing pressure of the gas to be supplied, and a temperature sensor for measuring a temperature of the optical element, wherein said decompression mechanism controls the pressure of the gas to be supplied, based on an output of the temperature sensor.

25. An exposure apparatus for illuminating a pattern with light and for exposing an object using the light from the pattern, said exposure apparatus comprising:
at least one optical element; and
a cooling mechanism for cooling an optical element disposed in a vacuum atmosphere, wherein the cooling mechanism includes a support part for supporting the optical element, said support part having a channel having an inlet into which gas is supplied, and an outlet, from which the gas is exhausted, and a decompression mechanism, connected to the channel, for reducing pressure of the gas to be supplied, and a temperature sensor for measuring temperatures of the optical element and/or the support part, wherein said decompression mechanism controls the pressure of the gas to be supplied, based on an output of the temperature sensor.

26. An exposure apparatus for illuminating a pattern with light and for exposing an object using the light from the pattern, said exposure apparatus comprising:
at least one optical element; and
a cooling mechanism for cooling an optical element disposed in a vacuum atmosphere, the optical element having a channel having an inlet into which gas is supplied, and an outlet, from which the gas is exhausted, wherein said cooling mechanism includes a decompression mechanism, connected to the channel, for reducing pressure of the gas to be supplied, and a temperature sensor for measuring a temperature of the optical element, wherein said decompression mechanism controls the pressure of the gas to be supplied, based on an output of the temperature sensor.

27. A device fabrication method comprising the steps of:
exposing an object by using an exposure apparatus that includes a cooling mechanism for cooling an optical element disposed in a vacuum atmosphere, wherein the cooling mechanism includes a support part for supporting the optical element, said support part having a channel having an inlet, into which gas is supplied, and an outlet, from which the gas is exhausted, and a decompression mechanism, connected to the channel, for reducing pressure of the gas to be supplied, and a temperature sensor for measuring temperatures of the optical element and/or the support part, wherein said decompression mechanism controls the pressure of the gas to be supplied, based on an output of the temperature sensor; and
developing the object that has been exposed.

28. A device fabrication method comprising the steps of:
exposing an object by using an exposure apparatus that includes a cooling mechanism for cooling an optical element disposed in a vacuum atmosphere, the optical element having a channel having an inlet into which gas is supplied, and an outlet, from which the gas is exhausted, wherein said cooling mechanism includes a decompression mechanism, connected to the channel, for reducing pressure of the gas to be supplied, and a temperature sensor for measuring a temperature of the optical element, wherein said decompression mechanism controls the pressure of the gas to be supplied, based on an output of the temperature sensor; and
developing the object that has been exposed.

29. A cooling mechanism for cooling an optical element disposed in a vacuum atmosphere, said cooling mechanism comprising:
a radiation member provided opposite to and apart from the optical element;
a Peltier element that contacts said radiation member in one area;
a radiation block that contacts the Peltier element in another area, and has a channel with an inlet to which gas is supplied, and an outlet from which the gas is exhausted;
a decompression mechanism, disposed in the channel, for reducing pressure of the gas supplied; and
a temperature sensor for measuring a temperature of the optical element,
wherein said decompression mechanism controls the pressure of the gas to be supplied, based on an output of the temperature sensor.

30. An exposure apparatus comprising:
at least one optical element for introducing light from a light source to an object to be exposed; and
a cooling mechanism for cooling the at least one optical element,
wherein said cooling mechanism includes:
a radiation member provided opposite to and apart from the optical element;
a Peltier element that contacts said radiation member in one area;
a radiation block that contacts the Peltier element in another area, and has a channel with an inlet to which gas is supplied, and an outlet from which the gas is exhausted;
a decompression mechanism, disposed in the channel, for reducing pressure of the gas supplied; and
a temperature sensor for measuring a temperature of the optical element, wherein said decompression mechanism controls the pressure of the gas to be supplied, based on an output of the temperature sensor.

31. A device fabrication method comprising the steps of:
exposing an object by using an exposure apparatus that includes at least one optical element for introducing light from a light source to an object to be exposed; and a cooling mechanism for cooling the at least one optical element,
wherein said cooling mechanism includes a radiation member provided opposite to and apart from the optical element, a Peltier element that contacts said radiation member in one area, a radiation block that contacts the Peltier element in another area, and has a channel with an inlet to which gas is supplied, and an outlet from which the gas is exhausted, a decompression mechanism, disposed in the channel, for reducing pressure of the gas supplied, and a temperature sensor for measuring a temperature of the optical element, wherein said decompression mechanism controls the pressure of the gas to be supplied, based on an output of the temperature sensor; and developing the object that has been exposed.

32. A cooling mechanism for cooling an optical element disposed in a vacuum atmosphere, said cooling mechanism comprising:
a support part for supporting the optical element, said support part having a channel having an inlet, into which gas is supplied, and an outlet, from which the gas is exhausted;
a decompression mechanism, connected to the channel, for reducing pressure of the gas to be supplied, using an orifice; and
a temperature sensor for measuring temperatures of the optical element and/or the support part, wherein said decompression mechanism changes a conductance of said orifice based on an output of the temperature sensor.

33. A cooling mechanism for cooling an optical element disposed in a vacuum atmosphere, the optical element having a channel having an inlet into which gas is supplied, and an outlet, from which the gas is exhausted, said cooling mechanism comprising:
a decompression mechanism, connected to the channel, for reducing pressure of the gas to be supplied, using an orifice; and a temperature sensor for measuring a temperature of the optical element, wherein said decompression mechanism changes a conductance of said orifice based on an output of the temperature sensor.

34. A cooling mechanism for cooling an optical element disposed in a vacuum atmosphere, said cooling mechanism comprising:

a support part for supporting the optical element, said support part having a channel having an inlet, into which gas is supplied, and an outlet, from which the gas is exhausted;

a decompression mechanism, connected to the channel, for reducing pressure of the gas to be supplied, but changing a cross section of the channel; and a temperature sensor for measuring temperatures of the optical element and/or the support part, wherein said decompression mechanism changes the cross section based on an output of the temperature sensor.

* * * * *